United States Patent
Azinger

(10) Patent No.: US 6,693,576 B2
(45) Date of Patent: Feb. 17, 2004

(54) METHODS AND APPARATUS PROVIDING MULTIPLE CONCURRENT ACQUISITION MODES IN A DIGITIZING MEASUREMENT INSTRUMENT

(75) Inventor: Frederick A. Azinger, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/155,501

(22) Filed: May 23, 2002

(65) Prior Publication Data

US 2003/0218553 A1 Nov. 27, 2003

(51) Int. Cl.[7] .............................................. H03M 1/12
(52) U.S. Cl. ....................................... 341/155; 341/143
(58) Field of Search ......................... 341/155, 50, 143; 702/67, 70, 33; 345/443; 375/242; 325/58

(56) References Cited

U.S. PATENT DOCUMENTS

| | | | | |
|---|---|---|---|---|
| 4,802,098 A | * | 1/1989 | Hansen et al. ................ 702/67 |
| 5,115,404 A | * | 5/1992 | Lo et al. ...................... 345/443 |
| 5,157,395 A | * | 10/1992 | Del Signore et al. ....... 341/143 |
| 5,517,105 A | | 5/1996 | Holzwarth | |
| 5,740,064 A | | 4/1998 | Witte et al. | |
| 5,790,133 A | | 8/1998 | Holcomb et al. | |
| 5,898,420 A | | 4/1999 | Timm | |
| 6,041,080 A | * | 3/2000 | Fraisse ......................... 375/242 |
| 6,121,799 A | * | 9/2000 | Moser ........................... 327/58 |

* cited by examiner

*Primary Examiner*—Jean Jeanglaude
(74) *Attorney, Agent, or Firm*—Moser, Patterson & Sheridan LLP; Thomas F. Lenihan; Willam K. Bucher

(57) ABSTRACT

A method and apparatus enabling the substantially concurrent operation of multiple decimators within a digitizing measurement device such as a digital storage oscilloscope (DSO), wherein the multiple decimators provide multiple processed sample streams that may be used for a composite presentation of input signal data.

18 Claims, 4 Drawing Sheets

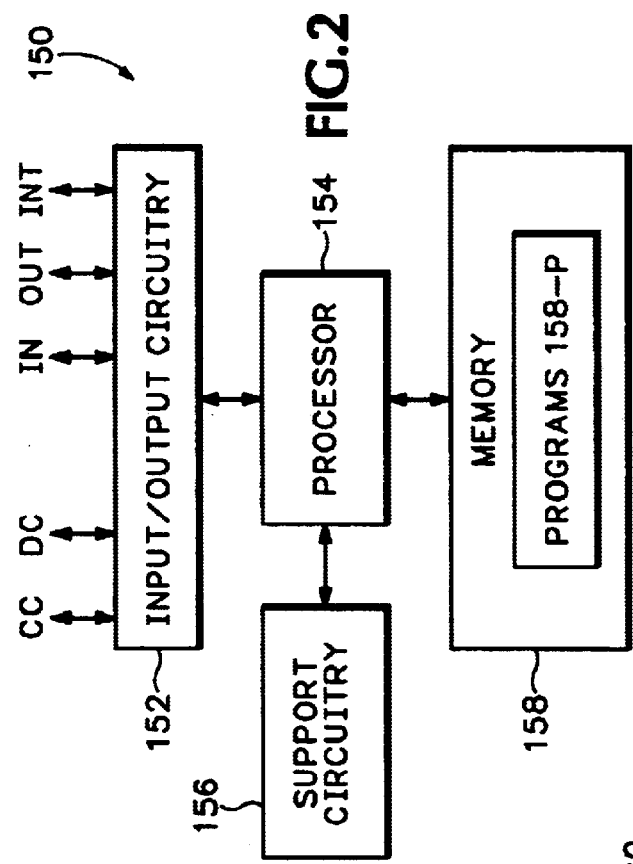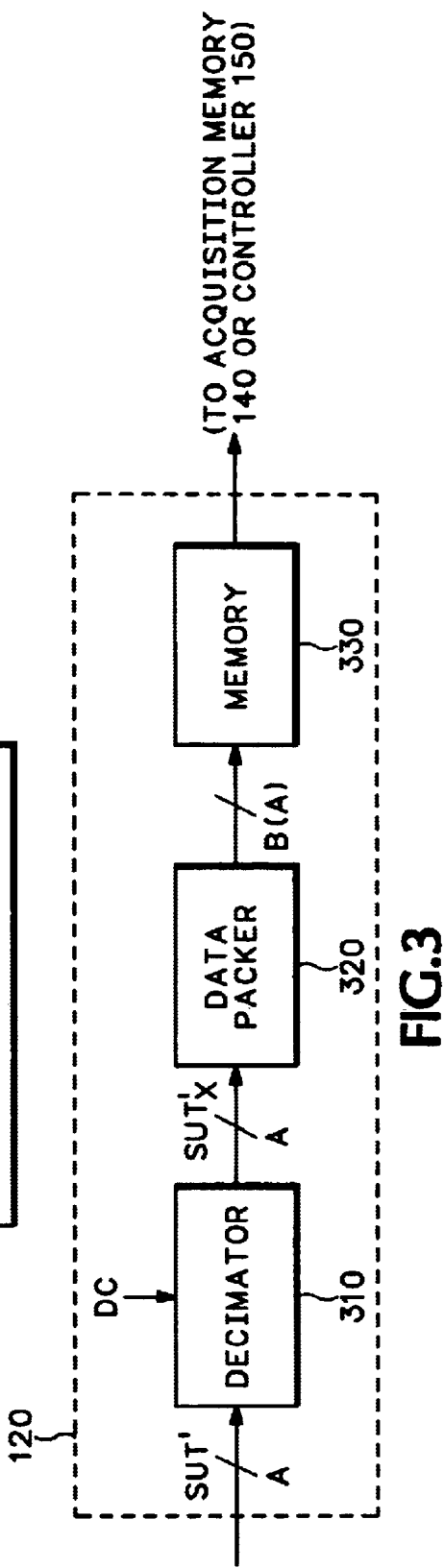

METHODS AND APPARATUS PROVIDING MULTIPLE CONCURRENT ACQUISITION MODES IN A DIGITIZING MEASUREMENT INSTRUMENT

TECHNICAL FIELD

The invention relates generally to signal analysis devices and, more specifically, to a method and apparatus for providing multiple presentations of contemporaneously acquired data.

BACKGROUND OF THE INVENTION

In a conventional digital storage oscilloscope (DSO), signal acquisition hardware is typically based upon one of two architectures that are used to achieve a desired time interval per sample, as requested by a user via a time/division selection input on the DSO. A first architecture controls a clocking input to an analog to digital (A/D) converter via the time/division setting. In this manner, the analog signal digitized by the A/D converter is digitized at a clock rate controlled by the time/division setting, such that the A/D converter is clocked at the correct speed to generate the desired number of samples. In a second architecture, the A/D converter is always clocked at a maximum sample rate to produce a maximum number of samples. The maximum number of samples are then decimated to reduce the sample rate to match a user's requested sample interval.

The decimation function described above may be implemented using a variety of algorithms. In some digital storage oscilloscopes manufactured by Tektronix, Inc. of Beaverton, Oreg., three decimation modes are provided; namely, a "normal" mode that provides sub-sampling, a "peak-detect" mode that provides for the detection of minimum and maximum samples and a "high resolution" mode that utilizes a box-car averaging algorithm.

The above-described decimation algorithms and other decimation algorithms tend to be mutually exclusive (i.e., only one type of decimation may be selected at one time) due, for example, to bandwidth limitations associated with memory within the digitizing measurement device.

SUMMARY OF THE INVENTION

These and other deficiencies of the prior art are addressed by the present invention of a method and apparatus enabling the concurrent operation of multiple decimators within a digitizing measurement device such as a digital storage oscilloscope. The multiple decimators provide multiple processed sample streams that may be used for a composite presentation of input signal data in a manner tending to be more meaningful to a test equipment user.

The subject invention is adapted, in one embodiment, to an apparatus comprising an analog to digital (A/D) converter for digitizing a signal to produce a stream of samples, a plurality of decimators, for concurrently processing the stream of samples according to respective decimation modes to produce respective decimated sample streams, and a memory, for storing the decimated sample streams.

BRIEF DESCRIPTION OF THE DRAWINGS

The teachings of the present invention can be readily understood by considering the following detailed description in conjunction with the accompanying drawings, in which:

FIG. 2 depicts a high level block diagram of a controller suitable for use in the signal analysis system of FIG. 1;

FIG. 3 depicts a high level block diagram of a processor/decimator suitable for use in the system of FIG. 1;

To facilitate understanding, identical reference numerals have been used, where possible, to designate identical elements that are common to the figures.

DETAILED DESCRIPTION OF THE INVENTION

The subject invention will be primarily described within the context of a measurement apparatus such as a digital storage oscilloscope (DSO). However, it will be appreciated by those skilled in the art that the invention may be advantageously employed in any signal measurement or analysis device in which contemporaneous multiple processing or decimation modes are desired to process one or a plurality of a signal(s) under test.

Figure 1:
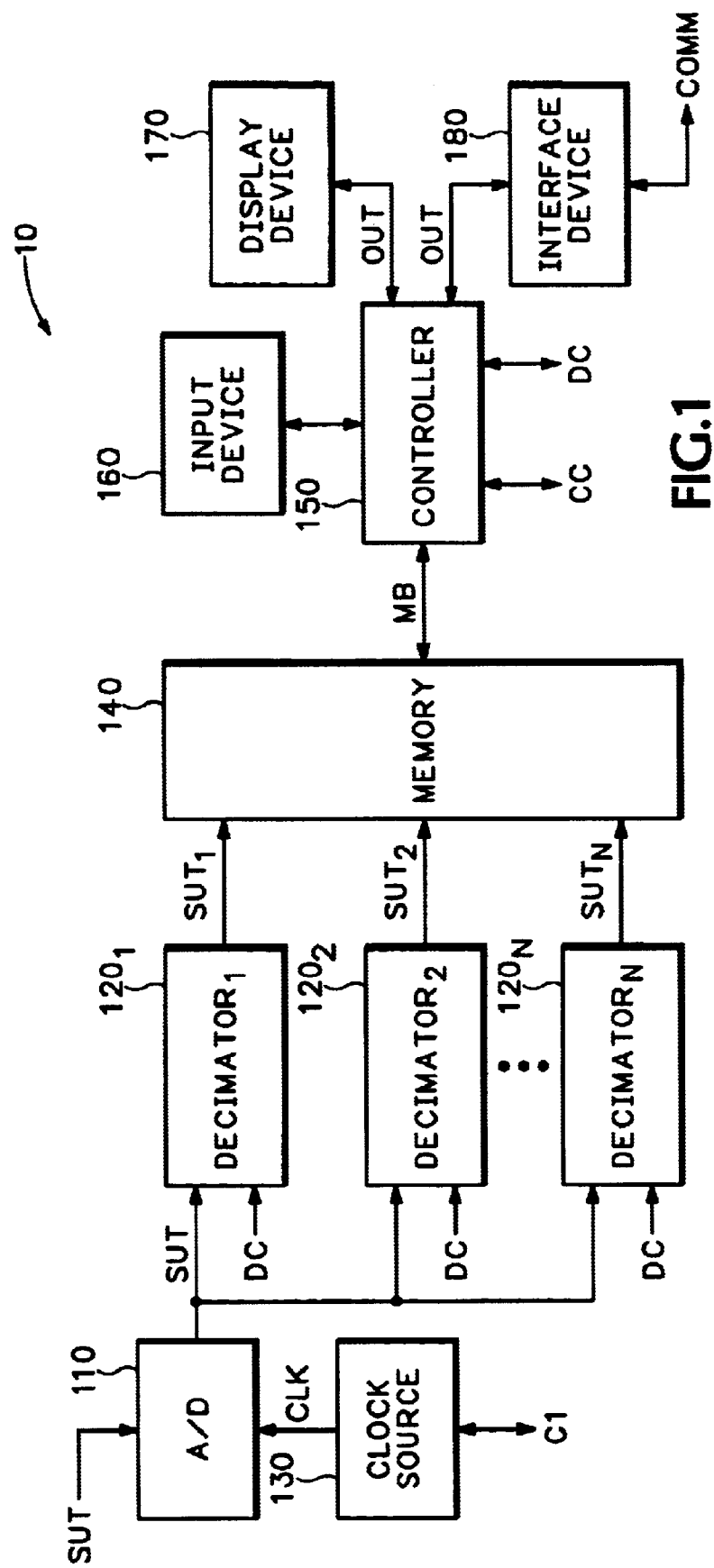
FIG. 1 depicts a high level block diagram of a signal analysis system.

FIG. 1 depicts a high level block diagram of a signal analysis device. Specifically, the signal analysis device 10 of FIG. 1 comprises an analog to digital (A/D) converter 110, a plurality of processing elements or decimators $120_1$ through $120_n$ (collectively decimators 120), a clock source 130, an acquisition memory 140, a controller 150, an input device 160, a display device 170 and an interface device 180.

The A/D converter 110 receives and digitizes a signal under test (SUT) in response to a clock signal CLK produced by the clock source 130. The clock signal CLK is preferably a clock signal adapted to cause the A/D converter 110 to operate at a maximum sampling rate, though other sampling rates may be selected. The clock source 130 is optionally responsive to a clock control signal CC produced by the controller 150 to change frequency and/or pulse width parameters associated with the clock signal CLK.

A digitized output signal SUT' produced by the A/D converter 110 is coupled to each of the processors/decimators 120. Each decimator 120 processes its received digitized signal SUT' according to a respective processing algorithm or decimation mode, such as a sub-sampling mode, a peak detection mode (e.g., min-max detection), a high resolution mode (e.g., a box-car averaging mode) or other mathematical function, algorithm, or mode. The mode of operation of each decimator 120 may be preprogrammed such as with an application specific integrated circuit (ASIC), or may be programmed "on the fly" in response to a decimator control signal DC produced by the controller 150. The decimators 120 may utilize different respective functions, the same respective functions or a combination thereof.

The decimators 120 operate concurrently to responsively produce respective output signals in response to received input signals SUT'. For example, in response to receiving input signal SUT', first decimator $120_1$ produces a decimated output signal $SUT_1'$, a second decimator $120_2$ produces a second decimated signal $SUT_2'$ and so on up to $n^{th}$ decimator $120_n$, which produces a decimated output signal $SUT_n'$. The decimators may be synchronized or singly operated at the same time on the same data in an asynchronous manner. The output signal $SUT_n'$ produced by the decimators 120 are stored in the acquisition memory 140. The acquisition memory 140 may be a contiguous or non-contiguous memory and may optionally allocate respective portions to the respective decimators.

The controller 150 is used to manage the various operations of the signal analysis device 10. The controller 150 performs various processing and analysis operations on the data samples stored within the acquisition memory 140. The controller 150 receives user commands via an input device 160, illustratively a keypad or pointing device. The controller 150 provides image-related data to a display device 170, illustratively a cathode ray tube (CRT), liquid crystal display (LCD) or other display device. The controller 150 optionally communicates with a communication link COMM, such as a general purpose interface bus (GPIB), internet protocol (IP), Ethernet or other communications link via the interface device 190. It is noted that the interface device 190 is selected according to the particular communications network used. An embodiment of the controller 150 will be described in more detail below with respect to FIG. 2.

Figure 5:
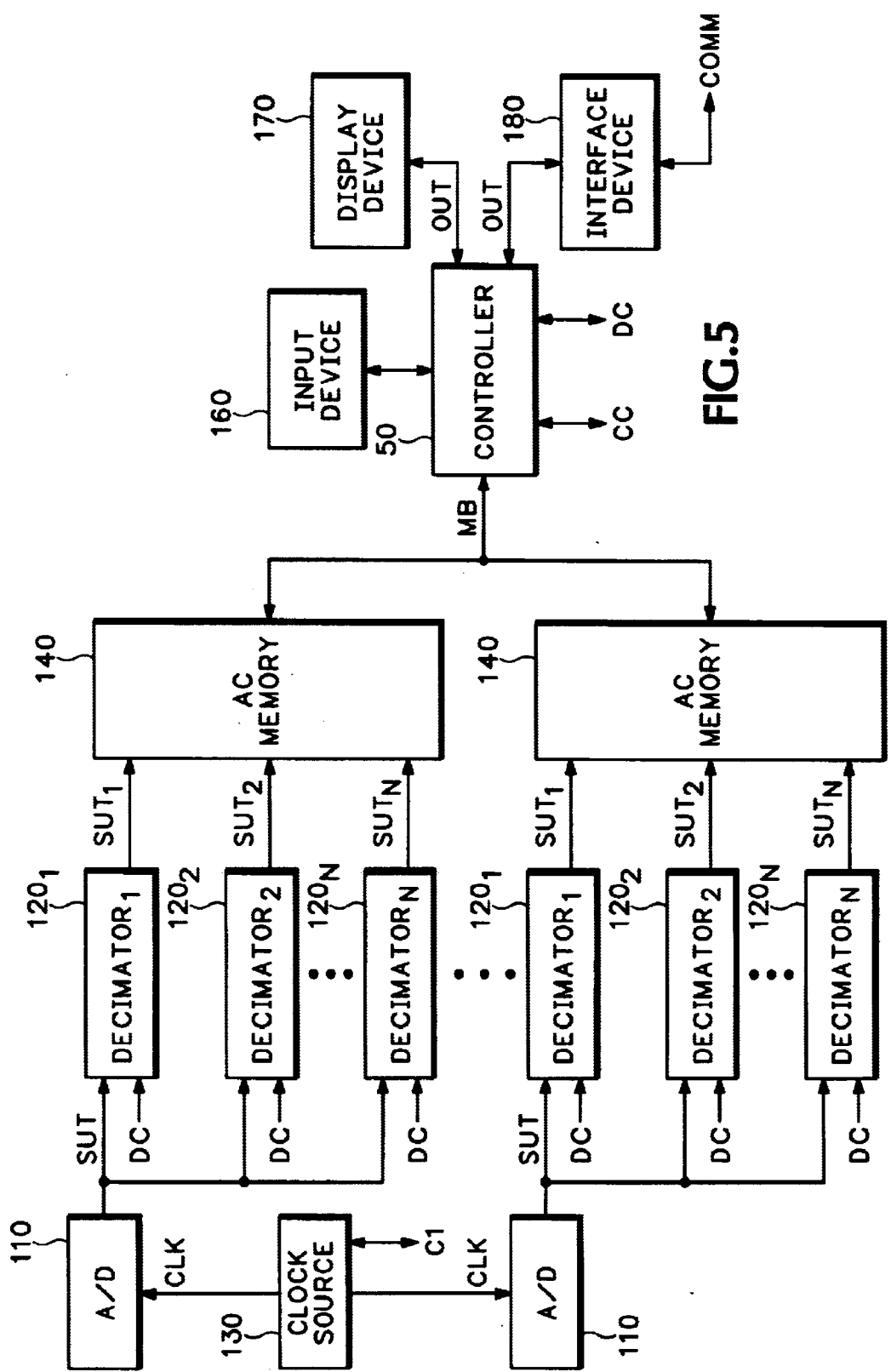
FIG. 5 depicts a high level block diagram of a signal analysis system capable of receiving multiple signals under test.

The signal analysis device 10 of FIG. 1 is depicted as receiving only one signal under test (SUT). However, it will be appreciated by those skilled in the art that many signals under test may be received and processed by the signal analysis device as shown in FIG. 5. Each signal under test is preferably processed using a respective A/D converter 110, which respective A/D converter may be clocked using the clock signal CLK provided by a common or respective clock source 130 or some other clock source. Each of the additional digitized signals under test is coupled to a respective plurality of decimators, which in turn provide samples to the acquisition memory 140 or additional acquisition memory. Any additional acquisition memory communicates with the controller 150, either directly or indirectly through an additional processing element. In one embodiment, the decimators 120 may be selectively used to process any input signal by the use of switching devices (not shown) under the control of controller 150.

FIG. 2 depicts a high level block diagram of a controller suitable for use in the signal analysis device 10 of FIG. 1. Specifically, the controller 150 of FIG. 2 comprises a processor 154 as well as memory 158 for storing various control programs 158-2. The processor 154 cooperates with conventional support circuitry 156 such as power supplies, clock circuits, cache memory and the like as well as circuits that assist in executing the software routines stored in the memory 158. As such, it is contemplated that some of the process steps discussed herein as software processes may be implemented within hardware, for example as circuitry that cooperates with the processor 154 to perform various steps. The controller 150 also contains input/output (I/O) circuitry 152 that forms an interface between the various functional elements communicating with the controller 150. For example, in the embodiment of FIG. 1, the controller 150 optionally communicates with the clock source 130 (via clock control signal CC) and one or more of the decimators 120 (via decimator control signal DC). The controller 150 also communicates with the input device 160 via a signal path IN, a display device 170 via a signal path OUT and the interface device 180 via a signal path INT and the acquisition memory 140 via signal path MB. The controller 150 may also communicate with additional functional elements (not shown), such as those described herein as relating to additional channels, SUT processing circuitry, switches, decimators and the like. It is noted that the memory 158 of the controller 150 may be included within the acquisition memory 140, that the acquisition memory 140 may be included within the memory 158 of the controller 150, or that a shared memory arrangement may be provided.

Although the controller 150 of FIG. 2 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

Referring now to FIG. 1, it will be appreciated by those skilled in the art that the term decimator as used within the context of the present invention should be broadly interpreted to include any processing function, such as the decimation functions described herein, filtering functions and other functions known to those skilled in the art.

Generally speaking, the invention is adapted to enabling substantially parallel processing or decimation of one or more sample streams to achieve one or more respective pluralities of processed streams which, are then stored in memory and made accessible for subsequent processing or presentation. It is noted that as the sample rate of the A/D converter increases, the minimum speed or bandwidth of the memory used must also increase. Where the memory speed or bandwidth cannot be practicably increased, the word size used by the memory is increased and the decimator or processing function output streams may be packed into memory words as appropriate. Where the size of the memory words increases to such a point that a corresponding memory module has insufficient pins (or where the number of decimators is such that the memory module has insufficient pins) it is desirable to include respective memory portions directly on the decimator or processor chips.

FIG. 3 depicts a high level block diagram of a processor/decimator suitable for use in the system of FIG. 1. Specifically, the processor/decimator 120 of FIG. 3 comprises a decimator function 310, a multiplexer or data packer function 320 and, optionally, a memory 330. As previously described, the decimator function 310 processes a digitized output signal SUT' produced by the A/D converter 110 to responsively produce an output signal $SUT_x$. In the example of FIG. 3, each of the input and output signals associated with the decimator 310 has a size "A," measured in bits (e.g., 8-bits) while the memory 330 has a word size measured in bits (e.g., 64-bits).

Each of the output signals $SUT_x'$ produced by the decimator function 310 is coupled to the multiplexer or data packer 320. The multiplexer or data packer 320 operates to combine or "pack" a plurality of decimator samples having a size of A-bits into a data word sized for use by the memory function 330. For example, if the acquisition memory 140 or memory function 330 utilizes a 64-bit word (B*A=64), and the decimator function 310 produces 8-bit samples (A=8), then eight samples from a decimator 310 are packed into a single 64-bit word, which word is then stored in the acquisition memory 140 or memory function 330. In this manner, the speed at which the acquisition memory must operate is approximately ⅛ (i.e., 64 divided by 8) of the decimator sample rate or A/D converter sample rate.

The acquisition memory 140 and/or memory function 330 cooperates with the controller 150 to store data samples provided by the decimator function 310 in a controlled manner such that samples from a desired decimator may be provided to the controller 150 for further processing and/or analysis.

The data packer 320 packs a plurality of decimated samples into an output word having a size adapted for use by the memory 330. Specifically, an integer number (B) of decimated samples $SUT_{x'}$ are packed into one memory word and stored in the memory 330.

The memory 330 may be coupled directly to the controller 150 or may be coupled to the acquisition memory 140. The memory 330 may comprise a small amount of scratch pad or buffer memory sufficient to store packed decimator samples prior to storage in the main acquisition memory 140, or the memory 330 may operate as the acquisition memory for the respective decimator.

In one embodiment of the invention, the decimator/processor 120 of FIGS. 1 and 3 is implemented as a system-on-chip, an integrated circuit or a plurality of components having a common substrate (preferably die-level components). The combined device includes all the combinational and sequential logic necessary to perform the appropriate decimator or processing function, as well as at least a minimum level of memory selected to have a word size and bandwidth that enables storage of multiplexed decimated samples. In this embodiment, the acquisition memory 140 comprises a plurality of acquisition memory modules (or a respective portion of a larger memory), where each of the acquisition memory modules (or respective memory portion) is fabricated on the same substrate as a respective decimator. In this manner, a very wide data word may be used for the memory, where such a very wide data word is normally inappropriate within the context of a discrete memory due to limitations in the number of pins (i.e., input and output connections) of a typical memory device. By using an extremely wide memory word (e.g., 128 bits, 256 bits, 512 bits, etc.), each memory word may be packed with a plurality of processed or unprocessed samples such that the memory speed or bandwidth constraints do not limit the speed at which the signal analysis device 10 operates. This slowing down or "spreading" of samples comprises a demultiplexing operation which may be used by any decimator to slow the effective rate at which data is stored in the acquisition memory 140.

The size of the word used to store data within the acquisition memory 140 is nominally limited by the number of pins or inputs provided by the acquisition memory 140. By fabricating each decimator 120 to include its own respective acquisition memory on a common substrate. In this manner, the pin limitation is avoided since the memory die may be coupled directly to the decimator die or data packer die.

In one embodiment of the invention, a relatively slow sample rate is used for the A/D converter 110. For example, assuming a 5 megasample per second sample rate used to produce a 12-bit wide sample stream SUT', the acquisition memory 140 may easily be selected to have sufficient speed to store each sample provided by a pass-through decimator function.

Figure 4:
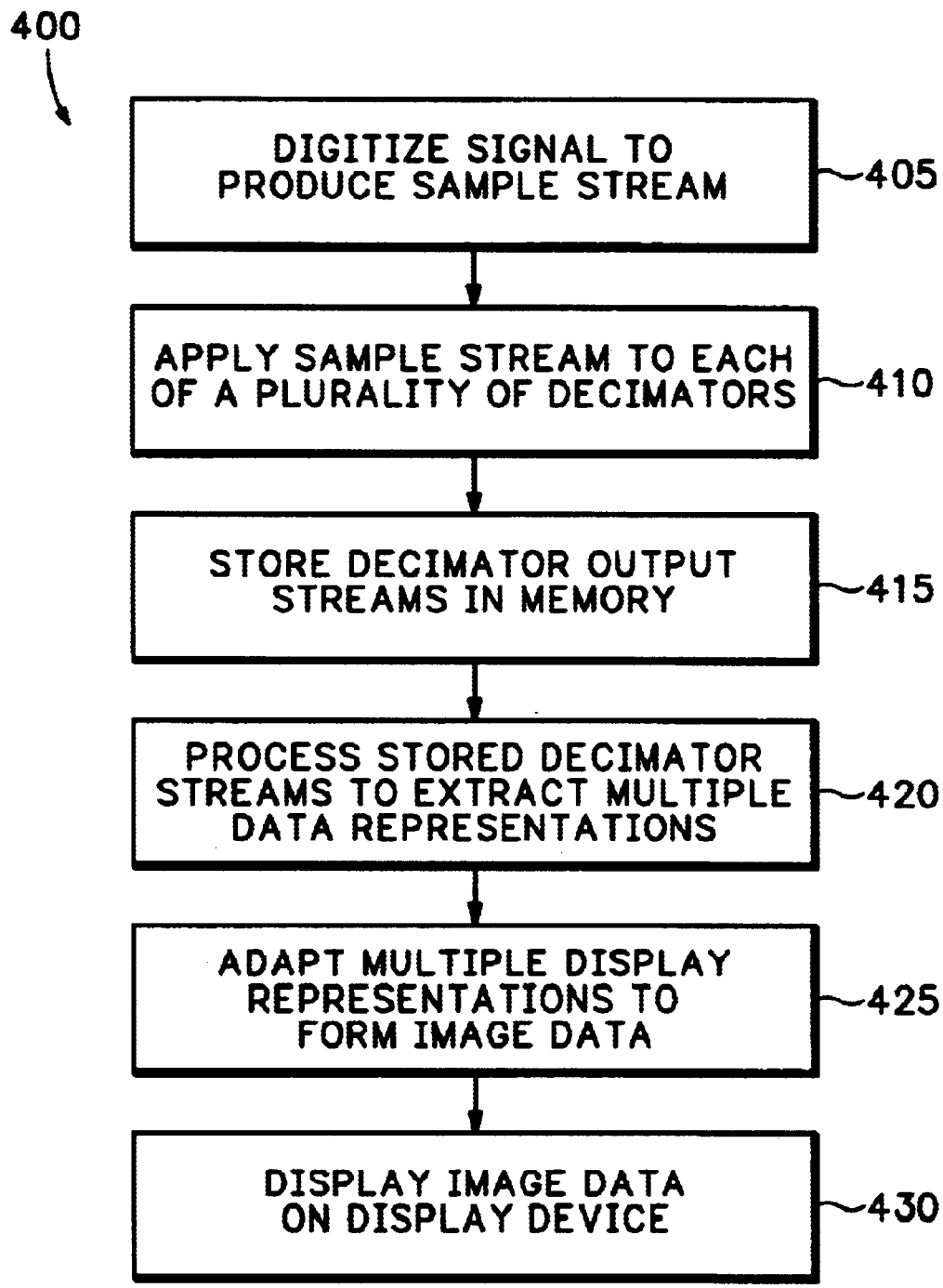
FIG. 4 depicts a flow diagram of a method according to the present invention.

FIG. 4 depicts a flow diagram of a method according to the present invention. The method 400 is entered at step 405, as an SUT is digitized by an A/D converter to produce a sample stream SUT'. At step 410, the sample stream SUT' is applied to each of a plurality of processors/decimators.

At step 415, each of the processors/decimators stores a respective decimated output sample stream in a respective memory, portion of memory, or common memory device. That is, at step 415 each of the decimators stores the decimated sample stream in a respective on-chip memory (as discussed above with respect to FIG. 3), a respective portion of an acquisition memory (e.g., a mapped portion of acquisition memory 140 or a combination of acquisition memory 140 and on-chip memory 330) or simply stored in acquisition memory 140 directly. If necessary, a data packing function is performed to store multiple decimated samples within a single memory word, thereby increasing the rate at which the acquisition memory may effectively store samples.

At step 420, the stored decimator stream samples are processed to extract therefrom multiple data representations. For example, the processor 150 of the system 10 of FIG. 1 may retrieve from the acquisition memory 140 (or decimator-specific memories 330) raw or processed sample information. The controller 150 then processes the information according to time per division, amplitude, coordinate transform and/or other processing techniques to produce multiple data representations. The multiple data representations may be derived from multiple decimator sample streams or from a single decimator sample stream.

At step 425, the multiple data representations are adapted to form image data. That is, at step 425, the multiple data representations determined at step 420 are used to generate image streams appropriate to, for example, the display device 170 (e.g., base band video streams). At step 430, the image data is displayed on a display device. Optionally, the image data may be propagated to other display devices via the interface device 180. It is noted that the interface device 180 may also be used to communicate raw sample data, decimated sample data, processed sample data and/or image data to other devices, such as a computer or other measuring device.

Although various embodiments which incorporate the teachings of the present invention have been shown and described in detail herein, those skilled in the art can readily devise many other varied embodiments that still incorporate these teachings.

What is claimed is:

1. Apparatus, comprising:
   at least a first plurality of decimators, with one or more of said decimators operating at different rates and performing different operations for concurrently processing a first stream of digitized samples according to respective decimation rates and operations to produce respective decimated sample streams;
   a memory, for storing said decimated sample streams; and
   a controller, for retrieving at least two decimated sample streams from said memory and responsively producing a display signal including multiple imagery representations derived from said at least two decimated sample streams.

2. The apparatus of claim 1, wherein said decimation modes include at least one of a sub-sampling function, a peak detection function, and a box-car averaging function.

3. The apparatus of claim 1, further comprising:
   a plurality of data packers, each of said data packers cooperating with a respective decimator to pack a plurality of decimated samples into memory words adapted for use by said memory.

4. The apparatus of claim 1, further comprising:
   a data packer, for processing said respective decimated sample streams to produce a respective stream of data words, each of said data words including a plurality of digitized samples.

5. The apparatus of claim 1 further comprising:
   at least a first analog to digital (A/D) converter, for digitizing at least a first signal to produce said first stream of digitized samples.

6. The apparatus of claim 5, further comprising:

a second analog to digital (A/D) converter, for digitizing a second signal to produce a second stream of digitized samples; and a second plurality of decimators, for concurrently processing a second stream of digitized samples according to respective decimation modes to produce respective second decimated sample streams;

said second decimated sample streams being stored in said memory.

7. The apparatus of claim 1, wherein each of said decimators has associated with it a portion of said memory, each decimator and respective memory portion being disposed upon a common substrate.

8. The apparatus of claim 1, wherein each decimator comprises a decimation function and a data packing function, fabricated as a single integrated circuit.

9. The apparatus of claim 8, wherein said integrated circuit further includes a memory function.

10. The apparatus of claim 1, wherein said apparatus comprises a digital storage oscilloscope (DSO).

11. The apparatus of claim 1, further comprising:

a second plurality of decimators, for concurrently processing a second stream of digitized samples according to respective decimation modes to produce respective second decimated sample streams.

12. A method, comprising:

concurrently processing a stream of samples using at least a first plurality of decimators with one or more of said decimators operating at different rates and performing different operations to produce a respective plurality of decimated sample streams;

storing said plurality of decimated sample streams in a memory; and retrieving at least two decimated sample streams from said memory and responsively producing a display signal including multiple imagery representations derived from said two decimated sample streams.

13. The method of claim 12, further comprising:

concurrently processing a second stream of samples using a second plurality of decimators with one or more of said decimators operating at different rates and performing different operations to produce a respective second plurality of decimated sample streams;

storing said second plurality of decimated sample streams in a second memory; and retrieving at least two of the second plurality of decimated sample streams from said second memory and responsively producing a display signal including multiple imagery representations derived from said two of the second plurality of decimated sample streams.

14. The method of claim 12, further comprising:

concurrently processing a second stream of samples using a second plurality of decimators with one or more of said decimators operating at different rates and performing different operations to produce a respective second plurality of decimated sample streams;

storing said second plurality of decimated sample streams in said memory; and retrieving at least two of the second plurality of decimated sample streams from said memory and responsively producing a display signal including multiple imagery representations derived from said two of the second plurality of decimated sample streams.

15. The method of claim 12, wherein at least one of said decimators performs a sub-sampling function.

16. The method of claim 12, wherein at least one of said decimators performs a peak detection function.

17. The method of claim 12, wherein at least one of said decimators performs a box-car averaging function.

18. A computer readable medium for storing instructions which, when executed by a processor, perform the steps of:

concurrently processing a stream of samples using at least a first plurality of decimators with one or more of said decimators operating at different rates and performing different operations to produce a respective plurality of decimated sample streams;

storing said plurality of decimated sample streams in a memory; and retrieving at least two decimated sample streams from said memory and responsively producing a display signal including multiple imagery representations derived from said two decimated sample streams.

* * * * *